US012672505B2

(12) United States Patent
Jang

(10) Patent No.: US 12,672,505 B2
(45) Date of Patent: Jun. 30, 2026

(54) SUBSTRATE PROCESSING APPARATUS, OPERATING METHOD THEREOF, AND PHOTO SPINNER EQUIPMENT

(71) Applicant: SEMES CO., LTD., Cheonan-si (KR)

(72) Inventor: Ho Jin Jang, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 65 days.

(21) Appl. No.: 18/507,070

(22) Filed: Nov. 12, 2023

(65) Prior Publication Data

US 2024/0178011 A1 May 30, 2024

(30) Foreign Application Priority Data

Nov. 29, 2022 (KR) ........................ 10-2022-0162648

(51) Int. Cl.
*H10P 70/00* (2026.01)
*G03F 7/16* (2006.01)
*H10P 72/00* (2026.01)

(52) U.S. Cl.
CPC .......... *H10P 72/0414* (2026.01); *H10P 70/15* (2026.01); *H10P 72/0448* (2026.01); *G03F 7/16* (2013.01); *G03F 7/168* (2013.01)

(58) Field of Classification Search
CPC ........ H01L 21/67017–6708; H10P 14/68–687; B08B 9/08–46
See application file for complete search history.

(56) References Cited

U.S. PATENT DOCUMENTS

| | | | |
|---|---|---|---|
| 10,074,548 B2 | 9/2018 | Sasagawa et al. | |
| 10,658,203 B2 | 5/2020 | Tsujikawa et al. | |
| 2014/0242284 A1* | 8/2014 | Shimai .................. | B05B 3/1064 |
| | | | 427/427 |

FOREIGN PATENT DOCUMENTS

| | | | | |
|---|---|---|---|---|
| JP | 2011254107 | A | * | 12/2011 |
| JP | 2014027201 | A | * | 2/2014 |
| JP | 2020-77754 | | | 5/2020 |
| KR | 20110080840 | A | * | 7/2011 |
| KR | 10-1155621 | | | 6/2012 |
| KR | 10-2397043 | | | 1/2016 |
| KR | 10-2018-0009709 | | | 1/2018 |
| KR | 10-2021-0028788 | | | 3/2021 |
| KR | 20210028788 | A | * | 3/2021 |
| KR | 10-2353775 | | | 6/2021 |
| WO | WO9400622 | | * | 1/1994 |

OTHER PUBLICATIONS

Office Action from the Korean Intellectual Property Office dated May 28, 2024.

* cited by examiner

*Primary Examiner* — Kaj K Olsen
*Assistant Examiner* — Richard Z. Zhang

(57) ABSTRACT

Disclosure provides a substrate processing apparatus, an operating method thereof, and photo spinner equipment, the substrate processing apparatus being capable of preventing fumes of processing liquid from blocking a duct. The substrate processing apparatus supplying processing liquid to a substrate to perform processing includes a substrate support unit configured to support the substrate, a liquid supply unit configured to supply liquid to the substrate, and a liquid recovery unit configured to recover the liquid from the substrate. The liquid recovery unit includes a recovery cup formed to surround the substrate support unit and an air injection unit configured to inject air to an internal space of the recovery cup.

12 Claims, 13 Drawing Sheets

1

SUBSTRATE PROCESSING APPARATUS, OPERATING METHOD THEREOF, AND PHOTO SPINNER EQUIPMENT

CROSS REFERENCE TO RELATED APPLICATION

The present application claims priority to Korean Patent Application No. 10-2022-0162648, filed Nov. 29, 2022, the entire contents of which are incorporated herein for all purposes by this reference.

BACKGROUND OF THE INVENTION

Field of the Invention

The present disclosure relates to a substrate processing apparatus performing processing by supplying processing liquid to a substrate, an operating method thereof, and photo spinner equipment including the substrate processing apparatus performing liquid processing with respect to the substrate.

Description of the Related Art

A semiconductor manufacturing process is a process of manufacturing a final product through several tens to hundreds of steps on a substrate (wafer). Each process may be performed by manufacturing equipment that performs the process. During the semiconductor manufacturing process, a coating process in which a liquid film is formed on a substrate is applied before a light exposure (lithography) process that is to form a pattern on the substrate. After the liquid film is formed on the substrate, and after light exposure, a heat treatment process (or a bake process) in which heat energy is applied to the substrate is performed. During the process of forming a liquid film on the substrate or of coating photoresist after light exposure, processing liquid is supplied to the substrate.

In the process of supplying the processing liquid to the substrate, a recovery cup is provided to recover the processing liquid splattering around the substrate, and the processing liquid recovered by the recovery cup is discharged outwards through a discharge port. Meanwhile, in case of a process using high-viscosity processing liquid, fumes generated by the processing liquid may be built up on walls of the recovery cup and a duct, and pipe clogging due to fumes may occur.

SUMMARY OF THE INVENTION

The present disclosure is intended to provide a substrate processing apparatus, an operating method thereof, and photo spinner equipment, the substrate processing apparatus being capable of preventing fumes of processing liquid from blocking a duct.

According to the present disclosure, a substrate processing apparatus configured to supply processing liquid to a substrate to perform processing, the substrate processing apparatus includes: a substrate support unit configured to support the substrate; a liquid supply unit configured to supply liquid to the substrate; and a liquid recovery unit configured to recover the liquid from the substrate. The liquid recovery unit may include: a recovery cup formed to surround the substrate support unit; and an air injection unit configured to inject air to an internal space of the recovery cup.

The liquid supply unit may include: a processing liquid supply nozzle configured to supply the processing liquid for processing of the substrate; and a cleaning liquid supply nozzle configured to supply cleaning liquid for cleaning of the recovery cup. When the substrate is located at the substrate support unit, the processing liquid supply nozzle may supply the processing liquid to the substrate, and when a jig provided to clean the recovery cup is located at the substrate support unit, the cleaning liquid supply nozzle may supply the cleaning liquid to the jig.

A circular groove may be formed to collect the cleaning liquid for cleaning of the recovery cup.

A discharge port through which the cleaning liquid may be discharged may be formed at a part of the groove, whether or not the discharge port is opened may be controlled by an opening and closing valve, the cleaning liquid may be discharged outwards through the discharge port, and volatile elements of the cleaning liquid may be discharged outwards through an inner exhaust port located in the recovery cup.

An internal space in which processing with respect to the substrate may be performed may be sealed by a housing and a cover, the cover being coupled to an upper surface of the housing, the cover may be formed to be inclined from the upper surface of the housing toward a center portion, and the center portion of the cover may include an air flow provision unit generating a downward air flow.

The air injection unit may be configured to inject the air in a direction inclined with respect to an outer wall of the recovery cup.

The air injection unit may include a plurality of air injection units and the plurality of air injection units may be installed on the outer wall of the recovery cup to inject the air so that the cleaning liquid collected in the recovery cup may be rotatable in a certain direction.

According to the present disclosure, an operating method of a substrate processing apparatus configured to supply processing liquid to a substrate to perform processing, the operating method includes: performing processing by supplying the processing liquid from a liquid supply unit with respect to the substrate seated on a substrate support unit; recovering the processing liquid splattering from the substrate by using a liquid recovery unit; and cleaning the liquid recovery unit. The cleaning of the liquid recovery unit may include: positioning a jig at the substrate support unit; supplying cleaning liquid to the jig to clean the liquid recovery unit; and circulating the cleaning liquid by injecting air to an internal space of a recovery cup surrounding the substrate support unit; and discharging the cleaning liquid.

According to the present disclosure, photo spinner equipment includes: an index module configured to transfer a substrate from a container in which the substrate may be received; a processing module configured to perform a coating process and a developing process with respect to the substrate, and including a substrate processing apparatus configured to perform liquid processing with respect to the substrate; and an interface module connecting the processing module to external light exposure equipment. The substrate processing apparatus may include: a substrate support unit configured to support the substrate; a liquid supply unit configured to supply processing liquid to the substrate; and a liquid recovery unit configured to recover the processing liquid from the substrate. The liquid recovery unit may include: a recovery cup formed to surround the substrate support unit; and an air injection unit configured to inject air to an internal space of the recovery cup.

According to the present disclosure, as air is injected to the internal space of the recovery cup through the air injection unit, fumes can be eliminated by the cleaning liquid without being built up in the recovery cup.

DETAILED DESCRIPTION OF THE DISCLOSURE

Figure 1:
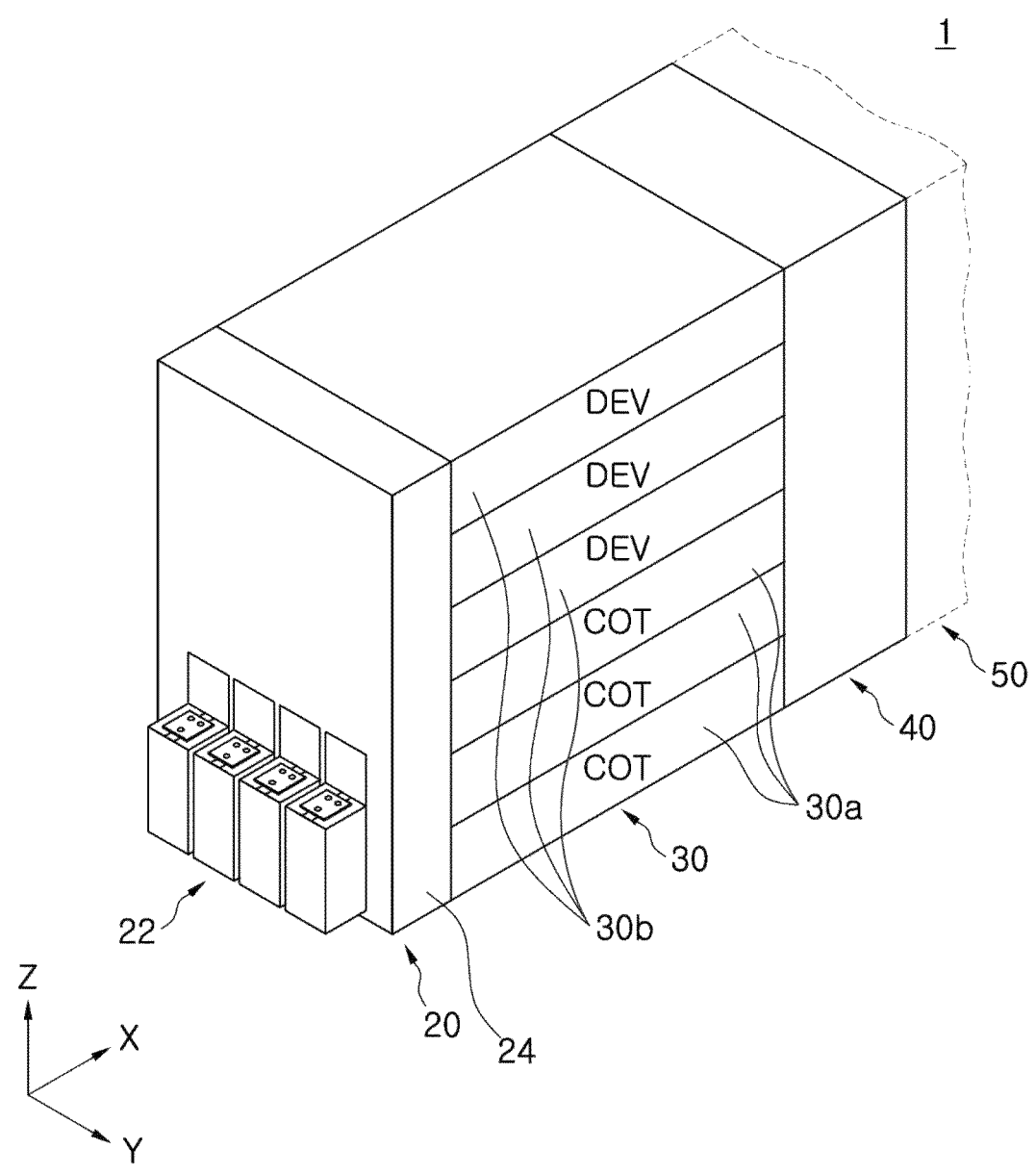
FIG. 1 is a view showing the exterior shape of photo spinner equipment to which the present disclosure may be applied.

Hereinbelow, exemplary embodiments of the present disclosure will be described in detail with reference to the accompanying drawings such that the present disclosure can be easily embodied by one of ordinary skill in the art to which the present disclosure belongs. The present disclosure may be changed to various embodiments and the scope and spirit of the present disclosure are not limited to the embodiments described hereinbelow.

In the following description, if it is decided that the detailed description of known function or configuration related to the present disclosure makes the subject matter of the present disclosure unclear, the detailed description is omitted, and the same reference numerals will be used throughout the drawings to refer to the elements or parts with same or similar function or operation.

Furthermore, in various embodiments, an element with same configuration will be described in a representative embodiment by using the same reference numeral, and different configuration from the representative embodiment will be described in other embodiment.

Other words used to describe the relationship between elements should be interpreted in a like fashion such as "between" versus "directly between", "adjacent" versus "directly adjacent", etc. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
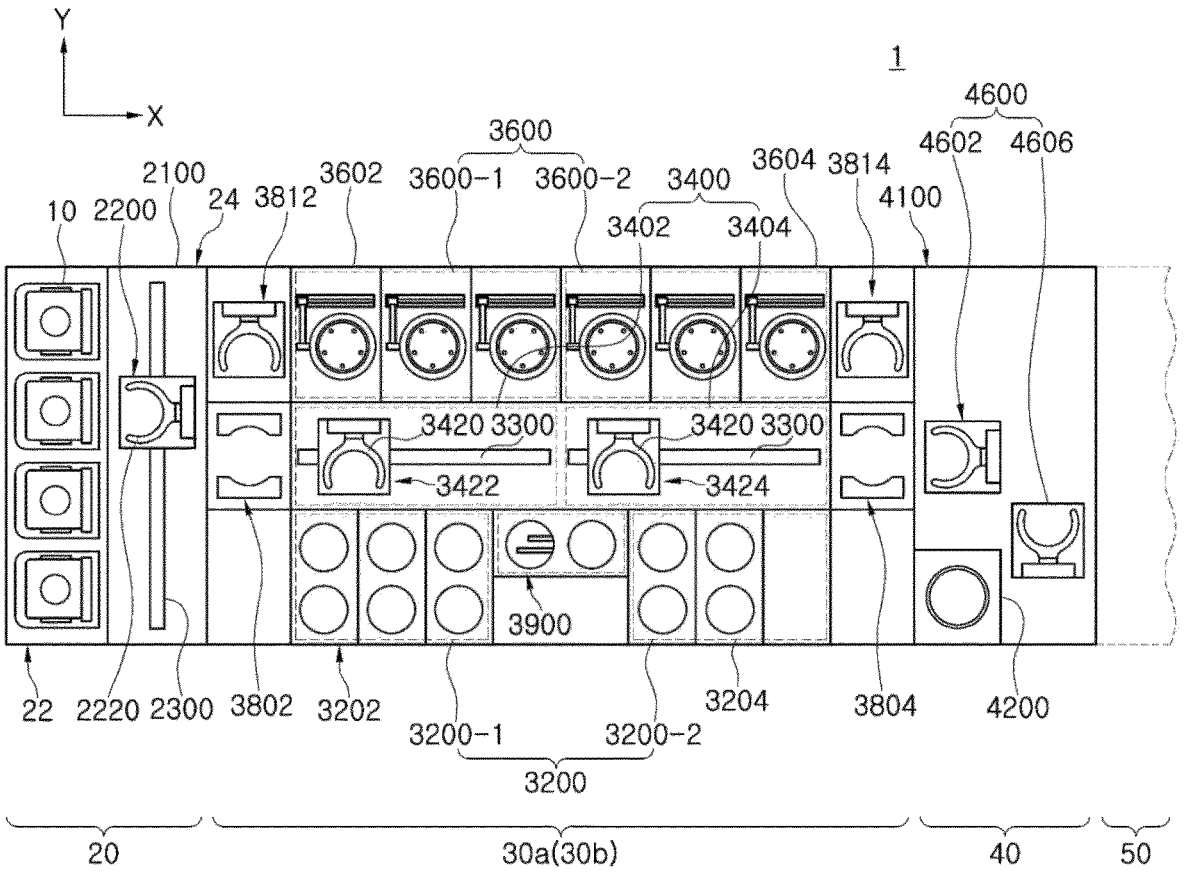
FIG. 2 is a view showing a schematic layout of the photo spinner equipment.
Figure 3:
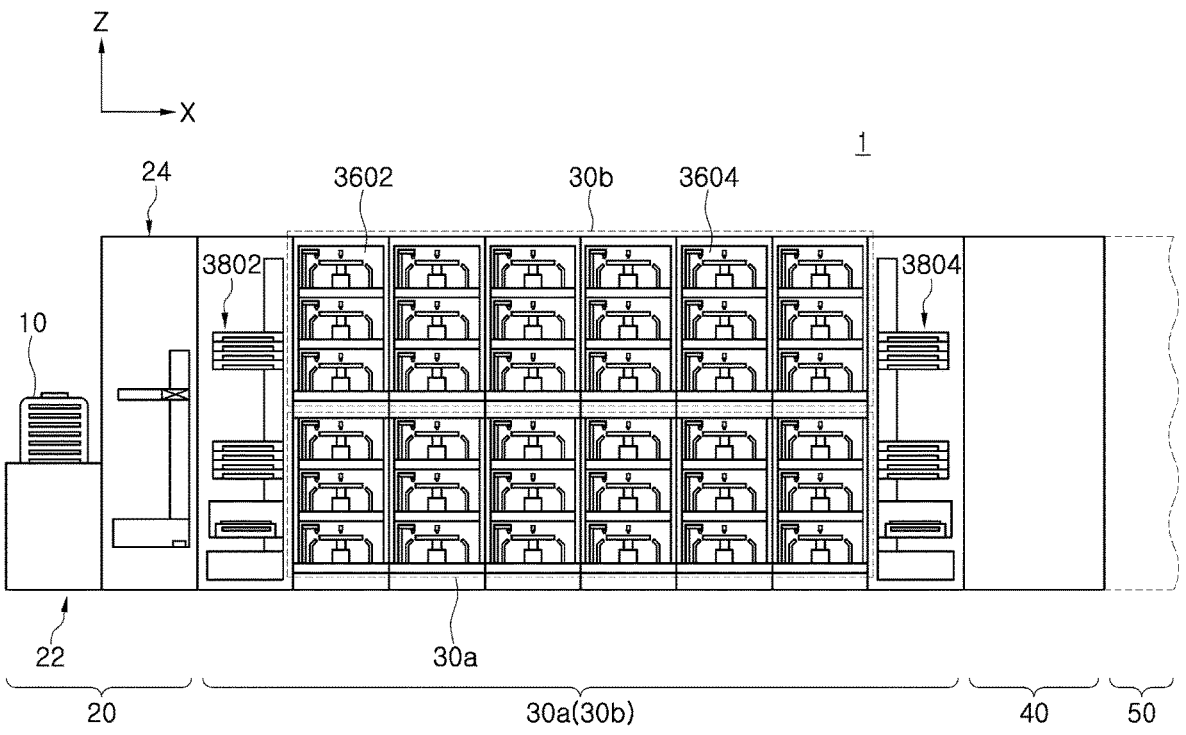
FIG. 3 is a view showing configuration of a processing module of the photo spinner equipment.

FIG. 1 is a view showing the exterior shape of photo spinner equipment 1 to which the present disclosure may be applied. FIG. 2 is a view showing a schematic layout of the photo spinner equipment 1. FIG. 3 is a view showing a structure of a processing module 30 of the photo spinner equipment 1.

Referring to FIGS. 1 to 3, the photo spinner equipment 1 includes an index module 20 transferring a substrate from a container 10 where the substrate is received, the processing module 30 performing a coating process and a developing process with respect to the substrate, and an interface module 40 connecting the processing module 30 to an external light exposure equipment 50.

The index module 20, the processing module 30, and the interface module 40 may be sequentially arranged. Hereinbelow, a direction in which the index module 20, the processing module 30, and the interface module 40 are arranged is referred to as a first horizontal direction X, and a direction perpendicular to the first horizontal direction X when viewed from the upper side is referred to as a second horizontal direction X, and a direction perpendicular to both the first direction X and the second horizontal direction X is referred to as a vertical direction Z.

The index module 20 transfers a substrate from the container 10 where the substrate is received to the processing module 30, and stores the substrate of which processing is completed into the container 10. A longitudinal direction of the index module 20 is provided as the second horizontal direction X. The index module 20 may include a load port 22 and an index frame 24. Based on the index frame 24, the load port 22 is located at the opposite side to the processing module 30. The container 10 where a substrate is received is placed in the load port 22. The load port 22 may include a plurality of load ports 22, and the plurality of the load ports 22 may be arranged in the second horizontal direction X.

An airtight container 10 such as a front open unified pod (FOUP) may be used as the container 10. The container 10 may be a transfer means (not shown) such as an overhead transfer, an overhead conveyor, or an automatic guided vehicle but may be placed on each load port 22 by an operator.

An index robot 2200 driven in an index transfer section 2100 is provided in the index frame 24. The index frame 24 includes a guide rail 2300 provided in the second horizontal direction X as a longitudinal direction thereof, and the index robot 2200 may be provided to be movable on the guide rail 2300. The index robot 2200 includes a hand 2220 on which the substrate is placed, and the hand 2220 may be provided to be movable forwards and rearwards, rotatable in the vertical direction Z, and movable in the vertical direction Z.

The processing module 30 may perform the coating process and the developing process with respect to the substrate.

The processing module 30 includes a coating block 30*a* and a developing block 30*b*. The coating block 30*a* performs the coating process with respect to the substrate, and the developing block 30b performs the developing process with respect to the substrate. The coating block 30a includes a plurality of coating blocks 30a, and the plurality of coating blocks 30a is provided to be stacked with each other. The developing block 30b includes a plurality of developing blocks 30b, and the plurality of developing blocks 30b is provided to be stacked with each other.

According to the embodiment of FIG. 1, the coating block 30a includes 3 coating blocks 30a, and the developing block 30b includes 3 developing blocks 30b. The coating blocks 30a may be respectively arranged below the developing blocks 30b. As an example, the 3 coating blocks 30a perform the same process, and may be provided with the same structure. Furthermore, the 3 developing blocks 30b perform the same process, and may be provided with the same structure. However, in the photo spinner equipment 1 to which the present disclosure may be applied, arrangement and configuration of the coating blocks 30a and the developing blocks 30b may not be limited to the structure shown in FIG. 1, and diverse changes may be applied thereto.

Referring to FIG. 2, each coating block 30a includes a bake unit 3200, a transfer unit 3400, and a liquid processing unit 3600.

The transfer unit 3400 serves to transfer the substrate between the bake unit 3200 and the liquid processing unit 3600 in each coating block 30a. The transfer unit 3400 may include a first transfer section 3402 as a first movement path, and a second transfer section 3404 as a second movement path. The first and second transfer sections 3402 and 3404 have a longitudinal direction provided in parallel with the first horizontal direction X and are connected to each other. The first, second transfer robot 3422, 3424 is provided in the first, second transfer section 3402, 3404.

As an example, the first, second transfer robot 3422, 3424 has a robot hand 3420 on which the substrate is placed, and the robot hand 3420 may be provided to be movable forwards and rearwards, rotatable in the vertical direction Z, and movable along the vertical direction Z. A guide rail 3300 is provided in the first, second transfer section 3402, 3404 provided in parallel to the first horizontal direction X, and the transfer robot 3422, 3424 may be provided to be movable on the guide rail 3300.

Referring to FIG. 2, the first, second transfer section 3402, 3404 may be provided with the same structure. The first transfer section 3402 is located closer to the index module 20, and the second transfer section 3404 is located closer to the interface module 40.

The bake unit 3200 performs a heat treatment process with respect to the substrate. The heat treatment process may include a cooling process and a heating process. The liquid processing unit 3600 supplies liquid on the substrate to form a liquid film. The liquid film may be a photoresist film and an antireflection film.

The liquid processing unit 3600 may include a first liquid processing part 3600-1 having liquid processing chambers coating an antireflection film on the substrate, and a second liquid processing part 3600-2 having liquid processing chambers coating a photoresist film on the substrate coated with the antireflection film. The first liquid processing part 3600-1 is arranged at one side of the first transfer section 3402, and the second liquid processing part 3600-2 is arranged at one side of the second transfer section 3404.

The liquid processing unit 3600 has a plurality of liquid processing chambers 360, 3604. The plurality of liquid processing chambers 360, 3604 may be arranged in a longitudinal direction of the transfer unit 3400. Furthermore, some of the plurality of liquid processing chambers 360, 3604 may be provided to be stacked with each other. The liquid processing unit 3600 may be the substrate processing apparatus according to the present disclosure.

The bake unit 3200 may include a first bake unit 3200-1 having heat processing chambers 3202 in which heat processing is performed to substrates for the antireflection film coating, and a second bake unit 3200-2 having heat processing chambers 3204 in which heat processing is performed to substrates for photoresist coating. The first bake unit 3200-1 is arranged at one side portion of the first transfer section 3402, and the second bake unit 3200-2 is arranged at one side portion of the second transfer section 3404. The heat processing chambers 3202 arranged at one side portion of the first transfer section 3402 are called front end heat processing chambers, and the heat processing chambers 3204 arranged at one side portion of the second transfer section 3404 are called rear end heat processing chambers.

In other words, the first liquid processing part 3600-1 and the first bake unit 3200-1 for forming the antireflection film on a substrate are arranged at the first transfer section 3402, and the second liquid processing part 3600-2 and the second bake unit 3200-2 for forming a photoresist film on a substrate are arranged at the second transfer section 3404.

Meanwhile, the processing module 30 includes a plurality of buffer chambers 3802, 3804. Among the plurality of buffer chambers 3802, 3804, a partial buffer chamber 3802 is arranged between the index module 20 and the transfer unit 3400. The buffer chamber 3802 may be called a front end buffer chamber 3802. The buffer chamber 3802, 3804 includes a plurality of buffer chambers to be located to be stacked with each other in the vertical direction Z. Among the plurality of buffer chambers 3802, 3804, another partial buffer chamber 3804 is arranged between the transfer unit 3400 and the interface module 40. The buffer chamber 3804 may be called a rear end buffer chamber 3804. The rear end buffer chamber 3804 includes a plurality of buffer chambers to be located to be stacked with each other in the vertical direction Z. Each of the front end buffer chamber 3802 and the rear end buffer chamber 3804 serves to store temporarily a plurality of substrates. Meanwhile, the plurality of buffer chambers 3802, 3804 may include buffer transfer robots 3812, 3814 to transfer a substrate.

An interface buffer 4100 provides a space in which the substrate transferred between each coating block 30a, an additional process chamber 4200, the light exposure equipment 50, and each developing block 30b temporarily stays during transferring. The interface buffer 4100 includes a plurality of interface buffers 4100, and the plurality of interface buffers 4100 may be provided to be stacked with each other.

A transfer member 4600 serves to transfer a substrate between the coating block 30a, the additional process chamber 4200, the light exposure equipment 50, and the developing block 30b. The transfer member 4600 may consist of 1 more robots. As an example, the transfer member 4600 may include a first interface robot 4602 and a second interface robot 4606.

The first interface robot 4602 may transfer a substrate between the coating block 30a, the additional process chamber 4200, and the interface buffer 4100. The second interface robot 4606 may transfer a substrate between the interface buffer 4100 and the light exposure equipment 50.

All hands of the index robot 2200, the first interface robot 4602, and the second interface robot 4606 may be provided to have the same shape as the robot hand 3420 of the transfer robot 3422, 3424. Selectively, a hand of a robot directly exchanging a substrate with a transfer plate of the heat processing chamber is provided to have the same shape as the robot hand 3420 of the transfer robot 3422, 3424, and hands of remaining robots may be provided to have different shapes therefrom.

Referring to FIG. 2 again, a cooling transfer module 3900 is provided for substrate transfer and substrate cooling between the first transfer robot 3422 and the second transfer robot 3424. The cooling transfer module 3900 is arranged at the bake unit 3200 adjacent to a boundary where the first movement path of the first transfer robot 3422 and the second movement path of the second transfer robot 3424 meet each other. The cooling transfer module 3900 may be arranged to be stacked in a multistage manner like the heat processing chamber.

Hereinbelow, the substrate processing apparatus according to the present disclosure, and the operating method of the substrate processing apparatus will be described. According to the present disclosure, the substrate processing apparatus and the operating method of the substrate processing apparatus may be applied as the liquid processing unit 3600 of the photo spinner equipment 1 and the operating method of the liquid processing unit 3600.

Figure 4:
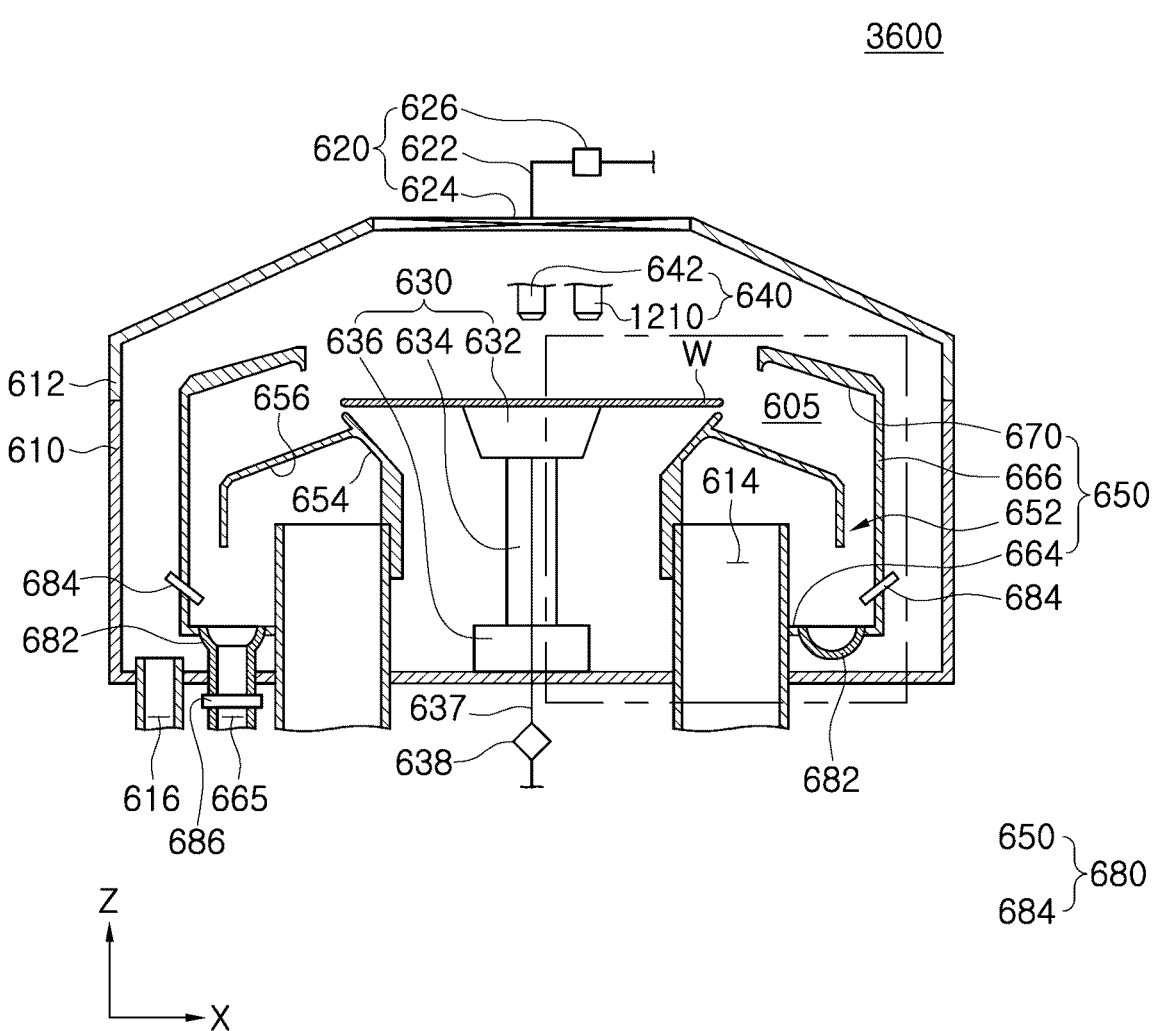
FIG. 4 is a view showing a state in which a substrate is seated on a substrate support unit in a substrate processing apparatus according to the present disclosure.
Figure 5:
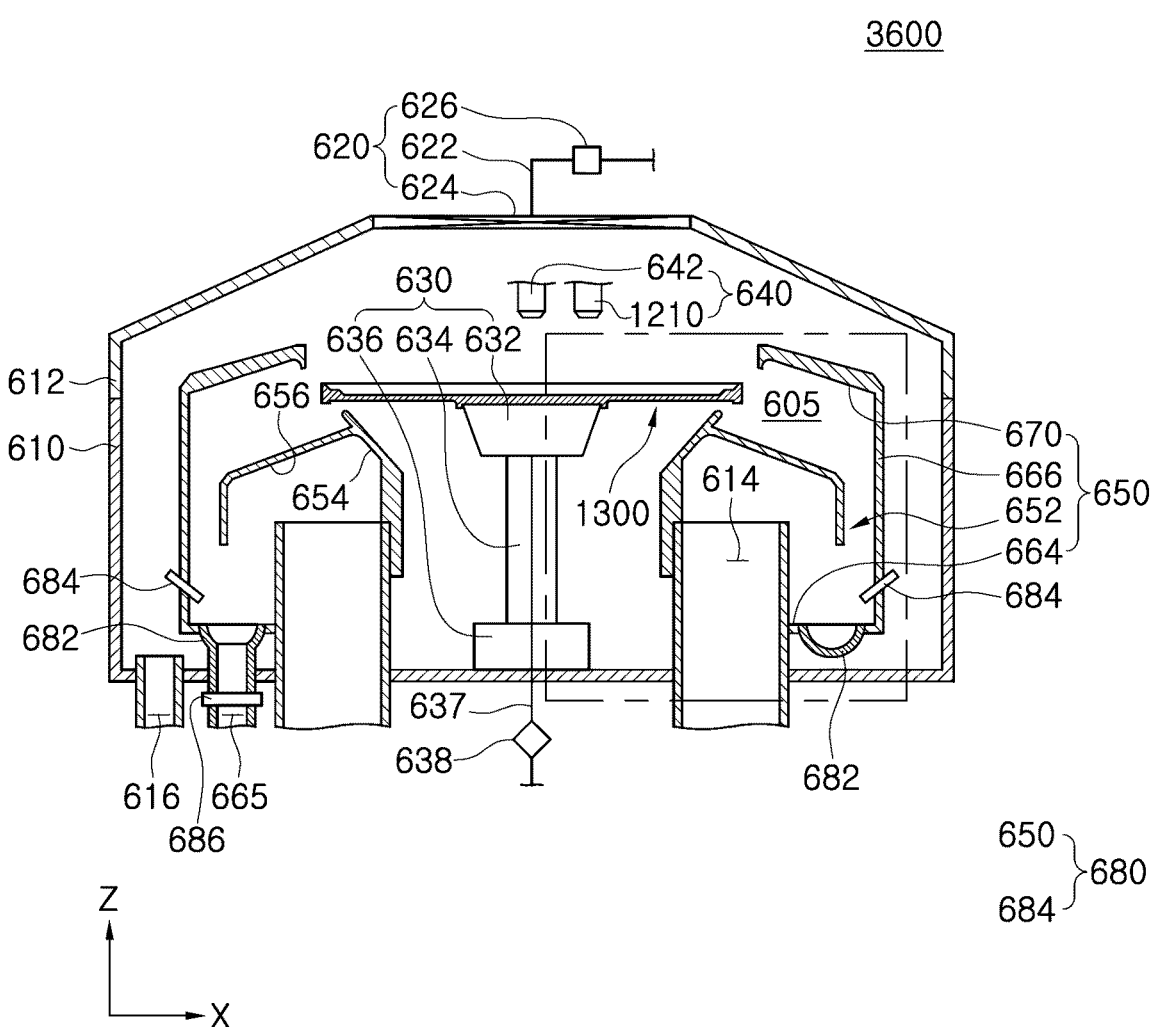
FIG. 5 is a view showing a state in which a jig for cleaning a recovery cup is seated on the substrate support unit in the substrate processing apparatus according to the present disclosure.

FIGS. 4 and 5 are sectional views showing an example of the liquid processing unit 3600 as the substrate processing apparatus. FIG. 4 is a view showing a state in which a substrate W is seated on a substrate support unit 630 in a substrate processing apparatus according to the present disclosure. FIG. 5 is a view showing a state in which a jig 1300 for cleaning a recovery cup 650 is seated on the substrate support unit 630 in the substrate processing apparatus according to the present disclosure. Referring to FIGS. 4 and 5, the liquid processing unit 3600 includes a housing 610, an air flow provision unit 620, the substrate support unit 630, a liquid supply unit 640, and a liquid recovery unit 680.

The housing 610 is provided into a rectangular container having a void therein. The housing 610 has an opening (not shown) formed at one side thereof. The opening serves as an entrance through which the substrate W is inserted. A door (not shown) is installed at the opening, and the door opens and closes the opening. When the substrate treatment process proceeds, the door blocks the opening to seal the internal space of the housing 610. Furthermore, the housing 610 is coupled to a cover 612 to seal the internal space. The cover 612 is coupled to an upper surface of the housing 610. The cover 612 seals the internal space of the housing 610 during the processing. The cover 612 may be opened from the housing 610 in order to perform installation or maintenance. When the housing 610 is sealed by the cover 612, volatile elements of the processing liquid or the cleaning liquid may be prevented from being discharged outwards. The cover 612 may be raised or lowered by a driving device (not shown). The cover 612 may be formed to be inclined towards a center portion from the upper surface of the housing 610. The air flow provision unit 620 generating a downward air flow is formed at the center portion of the cover 612. An inner exhaust port 614 and an outer exhaust port 616 are formed on a lower surface of the housing 610. An air flow generated in the housing 610 is discharged outwards through the inner exhaust port 614 and the outer exhaust port 616. As an example, an air flow in the recovery cup 650 may be discharged through the inner exhaust port 614, and an air flow outside the recovery cup 650 may be discharged through the outer exhaust port 616.

The air flow provision unit 620 may generate a downward air flow in the internal space of the housing 610. The air flow provision unit 620 is provided at the center portion of the cover 612. The air flow provision unit 620 includes an air flow supply line 622, a fan 624, and a filter 626. The air flow supply line 622 is connected to the cover 612. The air flow supply line 622 supplies external air to the internal space of the housing 610. The filter 626 filters the air provided through the air flow supply line 622. The filter 626 eliminates impurities contained in the air. The fan 624 is installed on an upper surface of the cover 612. The fan 624 is located at a center region in the upper surface of the cover 612. The fan 624 generates a downward air flow in the internal space of the housing 610. When air is supplied from the air flow supply line 622 to the fan 624, the fan 624 supplies the air in a downward direction.

The substrate support unit 630 supports the substrate W in the internal space of the housing 610. The substrate support unit 630 rotates the substrate W. The substrate support unit 630 includes a support plate 632, a rotary shaft 634, and an actuator 636. The support plate 632 is provided to have a circular plate shape. The substrate W is in contact with an upper surface of the support plate 632. As an example, a vacuum line 637 may be provided inside the support plate 632 to vacuum-adsorb the substrate W. A decompression member 638 may be installed at the vacuum line 637 to provide vacuum pressure. Accordingly, the support plate 632 may vacuum-suck the substrate W and may adsorb the substrate W. As another example, the support plate 632 may perform chucking with respect to the substrate W by a physical force.

When viewed from the upper side, the substrate W may be located such that a center shaft thereof is concentric with a center shaft of the support plate 632. The rotary shaft 634 may support the support plate 632 below the support plate 632. The rotary shaft 634 may be provided with a longitudinal direction facing the vertical direction (Z direction). The rotary shaft 634 may be provided to be rotatable thereon. The actuator 636 may provide a driving force so that the rotary shaft 634 is rotated. For example, the actuator 636 may be a motor.

The liquid supply unit 640 may supply a liquid on the substrate W. The supplied liquid may be processing liquid (e.g., photoresist) L1 or cleaning liquid (e.g., thinner) L2. A processing liquid supply nozzle 642 may supply the processing liquid L1 at a center position. At this point, the center position may be a position corresponding to the center region of the substrate W. The liquid supply unit 640 may include the processing liquid supply nozzle 642 supplying the processing liquid L1 for the processing of the substrate W and a cleaning liquid supply nozzle 1210 supplying the cleaning liquid for cleaning the recovery cup 650.

The recovery cup 650 may be provided to surround the substrate W in the internal space of the housing 610. The recovery cup 650 provides a recovery space 605 of the processing liquid L1. The recovery cup 650 is shaped in a cup shape having an open upper portion.

The recovery cup 650 provides a recovery path of the processing liquid L1 through an outer guide 670, an outer wall 666, an inner guide 656, and an inner wall 652. The recovery cup 650 is formed to be inclined upwards to face the substrate support unit 630. The recovery cup 650 is shaped in a ring shape.

A bottom surface 664 of the recovery cup 650 is shaped in a circular plate having a hollow. A discharge port 665 is connected to the bottom surface 664. The recovery cup 650 recovers the processing liquid L1 supplied to the substrate W. The processing liquid L1 recovered by the recovery cup 650 may be discharged outwards or reused. The outer wall 666 is shaped in a ring shape surrounding the substrate support unit 630. The outer wall 666 extends from a side end of the bottom surface 664 upwards (Z direction).

The outer guide 670 extends from an upper end of the outer wall 666 in a direction towards the center shaft of the recovery cup 650. The outer guide 670 is provided to be inclined upwards to face the substrate support unit 630. During the liquid treatment process of the substrate W, the upper end of the outer guide 670 is located higher than the substrate W supported by the substrate support unit 630.

Furthermore, the recovery cup 650 includes the inner wall 652, the inner guide 656, and an inner support 654. The inner guide 656 and the inner wall 652 may be provided as a region where the processing liquid L1 flows. The inner support 654 and the inner guide 656 may be provided to be inclined at different angles. As an example, the inner guide 656 is formed to be inclined downwards as being away from the substrate support unit 630. As an example, the inner support 654 may be inclined downwards in a direction towards the substrate support unit 630 and then extend vertically in a downward direction. When viewed from the upper side, the recovery cup 650 is located such that a part thereof is overlapped with the inner exhaust port 614. The inner guide 656 may prevent liquid from directly splattering into the inner exhaust port 614. The recovery cup 650 may be raised or lowered by a raising and lowering driving device (not shown).

Meanwhile, the bottom surface of the recovery cup 650 has a groove 682 where the processing liquid L1 may be collected. The groove 682 may be shaped in a circular shape when viewed from the upper side. The processing liquid L1 introduced into the recovery space 605 of the recovery cup 650 flows to the groove 682, and may be discharged through the discharge port 665 formed in a partial region of the groove 682. Then, the cleaning liquid for cleaning the processing liquid L1 remaining in the recovery cup 650 is collected in the groove 682 of the bottom surface 664 after cleaning the recovery cup 650. At this time, the discharge port 665 is in a closed state by an opening and closing valve 686 of the discharge port 665.

Then, an air injection unit 684 injects air to the internal space of the recovery cup 650. The air injection unit 684 may inject air towards the groove 682. The air injection unit 684 injects air to the cleaning liquid L2 collected in the groove 682, and the cleaning liquid L2 is rotated along the groove 682 by pressure of the air. The cleaning liquid L2 may eliminate byproduct (fume) of the processing liquid remaining in the groove 682 while being rotated along the groove 682.

Meanwhile, the cleaning liquid supply nozzle 1210 supplies the cleaning liquid L2 to the substrate W. The cleaning liquid L2 eliminates the processing liquid L1 remaining in the recovery cup 650. As an example, the cleaning liquid L2 may be thinner. The cleaning liquid supply nozzle 1210 supplies the cleaning liquid L2 to the jig 1300 as shown in FIG. 5. The cleaning liquid supply nozzle 1210 supplies cleaning liquid L2 at a position opposing the center region of the jig 1300 rotated. Selectively, the cleaning liquid supply nozzle 1210 supplies the cleaning liquid L2 while being moved between regions opposing the center region and an edge region of the rotated jig 1300.

The jig 1300 is supported and rotated by the substrate support unit 630. As an example, the substrate support unit 630 supplies vacuum pressure to a lower surface of the jig 1300 so as to support and adsorb the jig 1300. Selectively, the substrate support unit 630 may support and hold the jig 1300 by a mechanical clamping.

As an example, the jig 1300 is provided to have the same diameter as the substrate W. As an example, the jig 1300 has a shape thicker than the substrate W. As an example, the jig 1300 has a body and a rebound groove formed in the body. The rebound groove is shaped in an intaglio shape having a predetermined depth in the body. The rebound groove allows the cleaning liquid L2 discharged to the jig 1300 to hit the rebound groove and splatter to clean an inner wall of the recovery cup 650.

Figure 6:
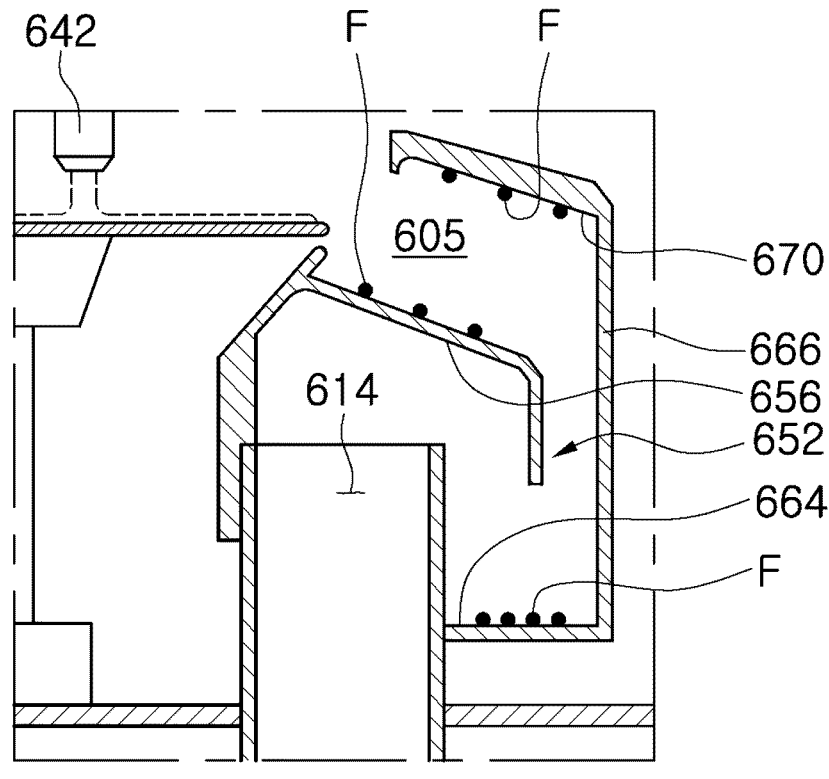
FIG. 6 is a view showing a recovery cup with foreign substances of processing liquid therein, in a substrate processing apparatus according to the related art.

The configuration and operation of the substrate processing apparatus according to the present disclosure will be described in detail. According to the present disclosure, the substrate processing apparatus (e.g., the liquid processing unit 3600) supplying the processing liquid L1 to the substrate to perform the processing includes the substrate support unit 630 supporting the substrate W, the liquid supply unit 640 supplying liquid to the substrate W, and the liquid recovery unit 680 recovering the processing liquid from the substrate W. The liquid recovery unit 680 includes the recovery cup 650 provided to surround the substrate support unit 630, and the air injection unit 684 injecting air to the internal space of the recovery cup 650. According to the present disclosure, the cleaning liquid L2 may be collected in the recovery cup 650. The cleaning liquid L2 may be collected in the groove 682 formed in the bottom surface 664 of the recovery cup 650. The air injection unit 684 may inject air to the cleaning liquid L2 collected in the groove 682. The cleaning liquid L2 may be circulated by pressure of the air. By circulation of the cleaning liquid L2, the fumes of the processing liquid L1 recovered in the recovery cup 650 may be eliminated without remaining. As shown in FIG. 6, when the groove 682 and the air injection unit 684 are not provided, the byproduct F of the processing liquid L1 is built up on the outer guide 670 and the inner guide 656, and the bottom surface 664 of the recovery cup 650. At this point, as the cleaning liquid is supplied to the jig 1300, the outer guide 670 and the inner guide 656 of the recovery cup 650 may be cleaned. However, since the cleaning liquid is immediately discharged through the discharge port 665 of the recovery cup 650, it is difficult to clean the byproduct F built up on the bottom surface 664. The byproduct F of the processing liquid L1 built up on the bottom surface 664 may then rise along an air flow to be also built up in the inner exhaust port 614, so that it is important to eliminate the byproduct F of the bottom surface 664 in order to induce an air flow smoothly.

Figure 7:
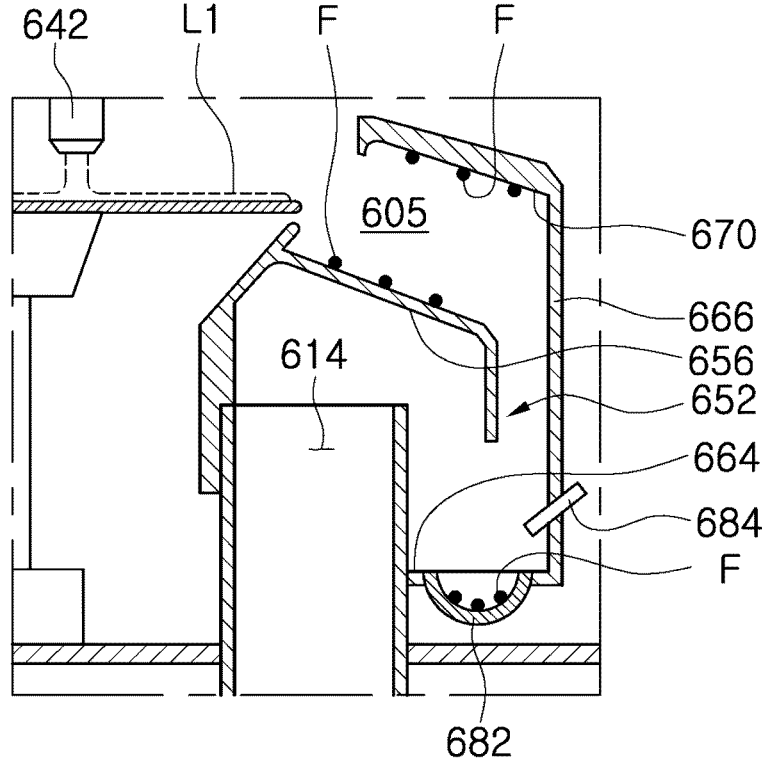
FIG. 7 is a view showing the recovery cup with foreign substances of processing liquid therein, in the substrate processing apparatus according to the present disclosure.
Figure 8:
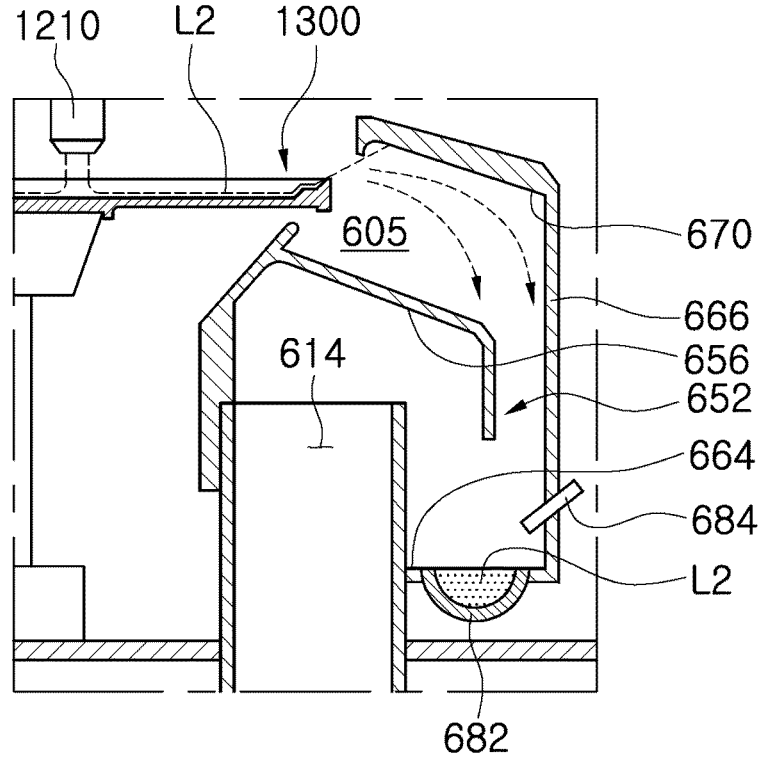
FIGS. 8 to 10 are views showing a process of removing foreign substances of the processing liquid in the substrate processing apparatus according to the present disclosure.

According to the present disclosure, the liquid supply unit 640 includes the processing liquid supply nozzle 642 supplying the processing liquid L1 for the processing of the substrate W and the cleaning liquid supply nozzle 1210 supplying the cleaning liquid L2 for cleaning the recovery cup 650. When the substrate W is located at the substrate support unit 630, the processing liquid supply nozzle 642 supplies the processing liquid L1 to the substrate W. When the jig 1300 for cleaning of the recovery cup 650 is located at the substrate support unit 630, the cleaning liquid supply nozzle 1210 supplies the cleaning liquid L2 to the jig 1300. When the process of supplying the processing liquid L1 to the substrate W is performed more than a certain number of times by the processing liquid supply nozzle 642, as shown in FIG. 7, the byproduct F of the processing liquid L1 may be built up on the outer guide 670, the inner guide 656, and the groove 682 of the bottom surface 664 of the recovery cup 650. When a condition for the cleaning of the recovery cup 650 is met, the cleaning processing with respect to the recovery cup 650 may be performed. As shown in FIG. 8, the cleaning liquid supply nozzle 1210 discharges the cleaning liquid L2 to the jig 1300 to allow the cleaning liquid L2 to clean the outer guide 670 and the inner guide 656 of the recovery cup 650. Furthermore, the cleaning liquid L2 is collected in the groove 682 of the bottom surface 664.

Figure 10:
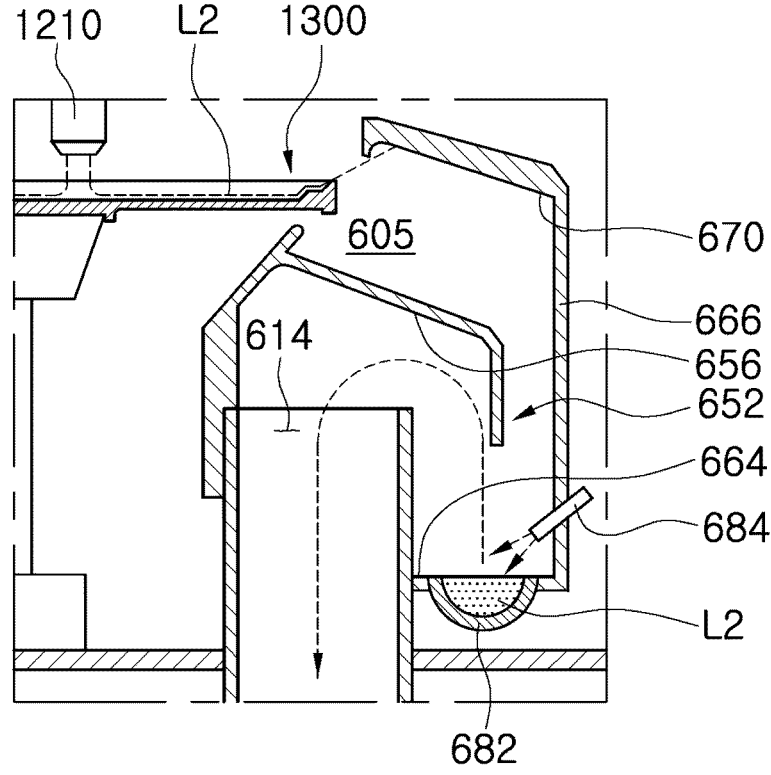

According to the present disclosure, as shown in FIG. 10, the groove 682 may be shaped in a circular shape so that the cleaning liquid L2 for cleaning of the recovery cup 650 may be collected. The discharge port 665 through which the cleaning liquid L2 may be discharged is formed in a part of the groove 682, and the opening and closing valve 686 may control whether or not the discharge port 665 is opened. When the processing liquid L1 is supplied, the opening and closing valve 686 is opened and the processing liquid L1 may be discharged through the discharge port 665, and when the cleaning liquid L2 is supplied, the opening and closing valve 686 is closed and the cleaning processing with respect to the cleaning liquid L2 may be performed. After the cleaning processing is completed, the opening and closing valve 686 is opened and the cleaning liquid L2 may be discharged through the discharge port 665. Volatile elements of the cleaning liquid L2 may be discharged through the inner exhaust port 614.

Figure 9:
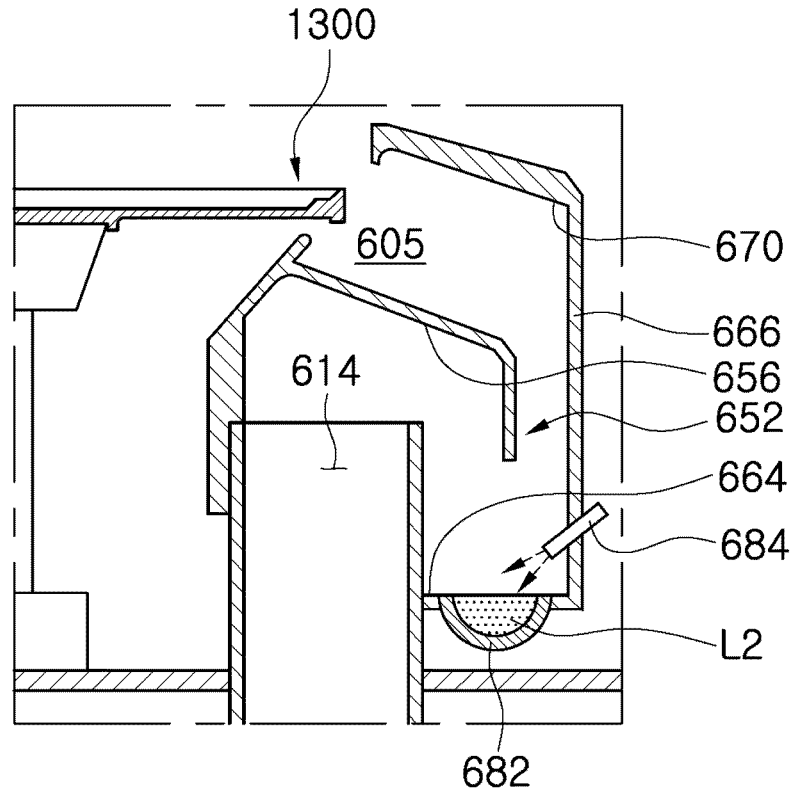
Figure 11:
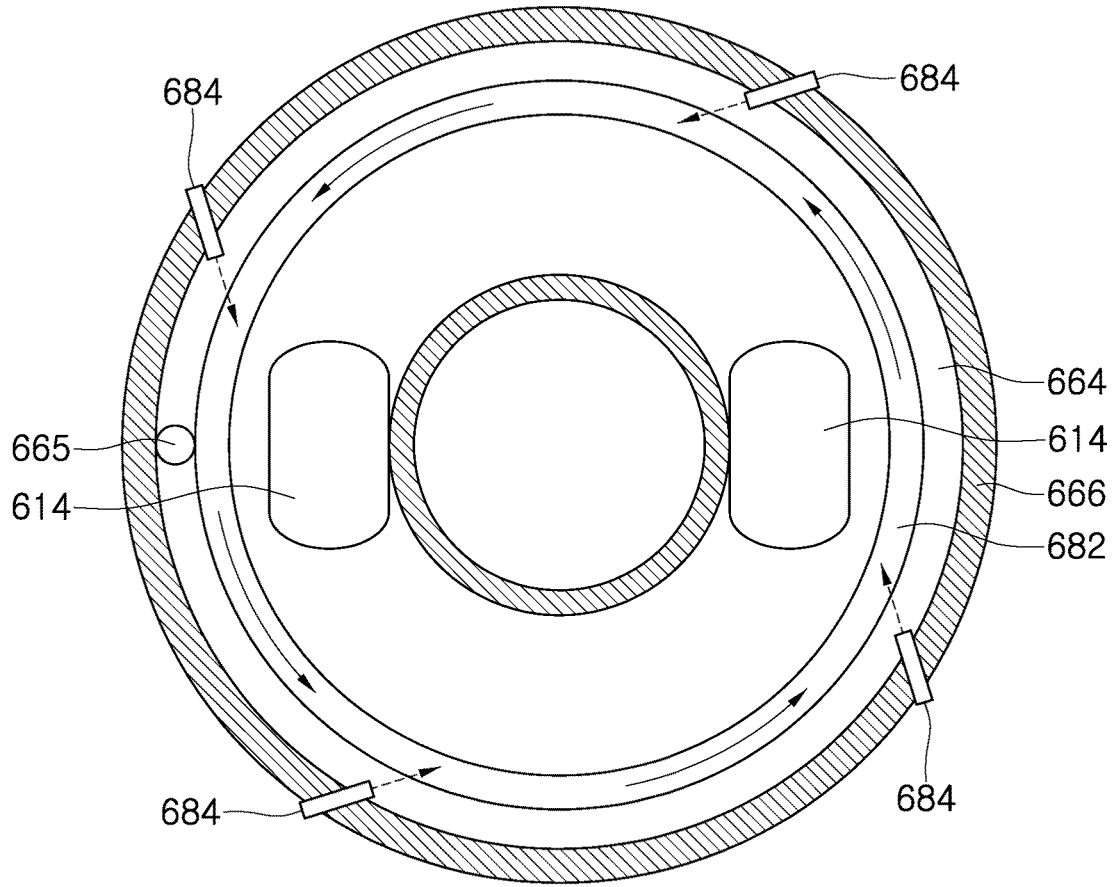
FIG. 11 is a top view showing a structure of a liquid recovery unit.

While the cleaning liquid L2 is collected in the groove 682, the cleaning liquid L2 may be circulated by air injected by the air injection unit 684. As shown in FIG. 9, the air injection unit 684 may be provided at the outer wall 666 of the recovery cup 650. The air injection unit 684 may inject air in a direction inclined with respect to the outer wall 666 of the recovery cup 650. Then, the opening and closing valve 686 is opened and the cleaning liquid L2 may be discharged through the discharge port 665. Furthermore, as shown in FIG. 10, the volatile elements (gas) of the cleaning liquid L2 may be discharged through the inner exhaust port 614. Negative pressure may be applied to the inner exhaust port 614 to discharge gaseous elements. As shown in FIG. 11, the air injection unit 684 is installed to be inclined with respect to the outer wall 666 of the recovery cup 650 and may inject air. The cleaning liquid L2 collected in the groove 682 may be circulated in a certain direction (e.g., counterclockwise) by air pressure. The air injection unit 684 includes a plurality of air injection units installed on the outer wall 666 of the recovery cup 650 and may inject air so that the cleaning liquid collected in the groove 682 may be rotated in a certain direction. For example, as shown in FIG. 11, the air injection unit 684 may be composed of a plurality of air injection units arranged at constant intervals on the outer wall 666 of the recovery cup 650.

Figure 12:
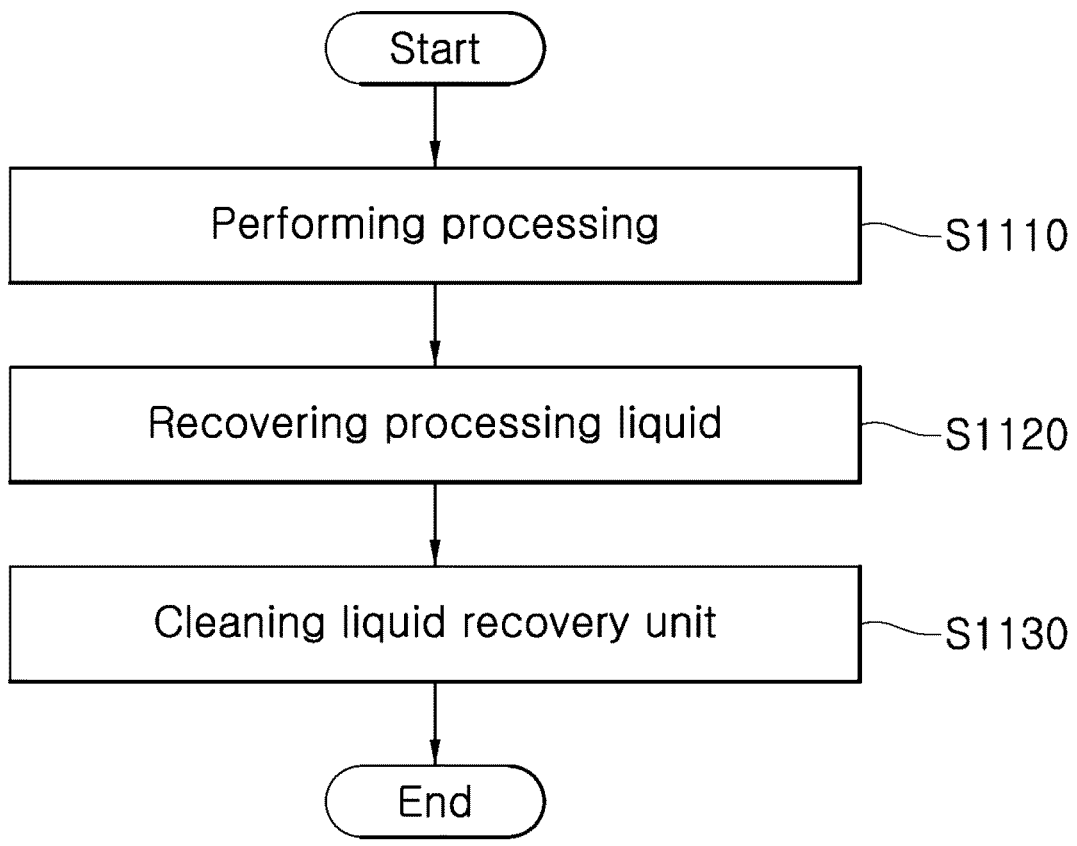
FIGS. 12 to 13 are flowcharts showing an operating method of the substrate processing apparatus according to the present disclosure.
Figure 13:
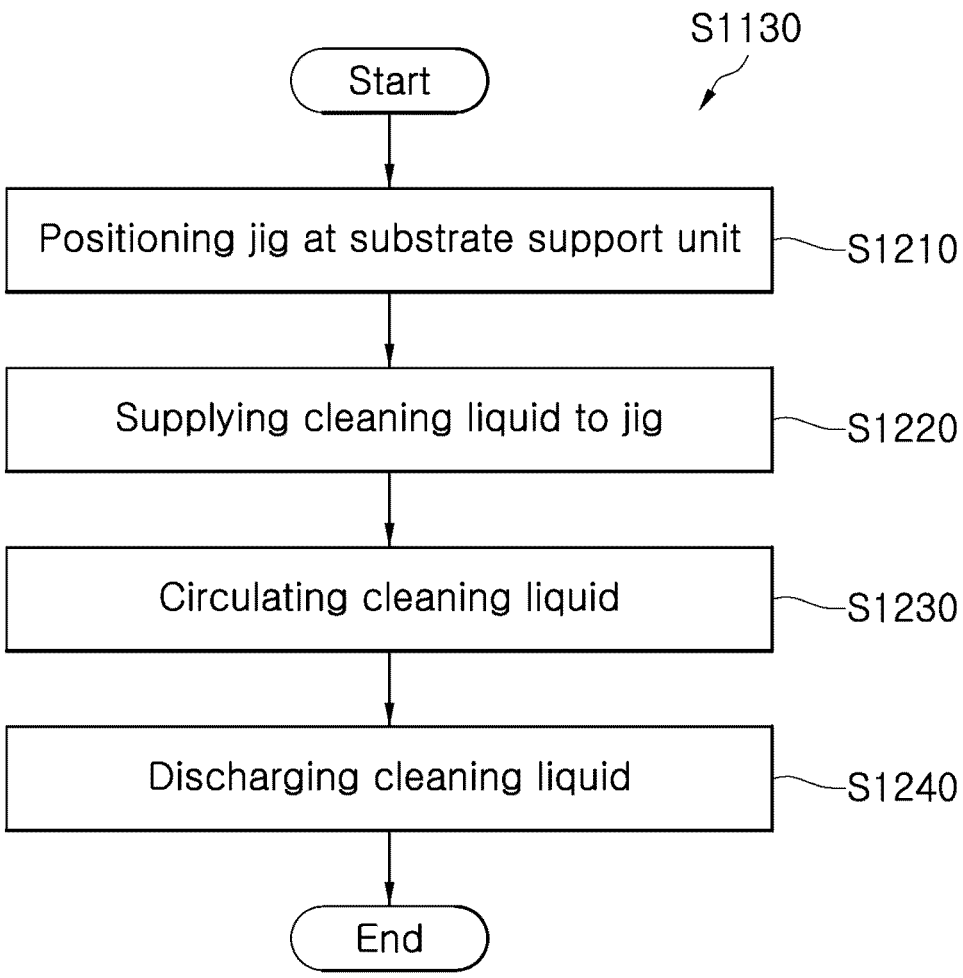

FIGS. 12 to 13 are flowcharts showing an operating method of the substrate processing apparatus (e.g., the liquid processing unit 3600) according to the present disclosure.

The operating method of the substrate processing apparatus performing the processing by supplying the processing liquid to the substrate W includes performing the processing by supplying the processing liquid L1 from the liquid supply unit 640 to the substrate W seated on the substrate support unit 630 at S1110, and recovering the processing liquid L1 by the liquid recovery unit 680 at S1120, the processing liquid splattering from the substrate W, and cleaning the liquid recovery unit 680 at S630. In S1110 and S1120, when the substrate W is located at the substrate support unit 630, the processing liquid supply nozzle 642 supplies the processing liquid L1 to the substrate W. The processing liquid L1 splattering from the substrate W is recovered to the recovery cup 650, and may be discharged or reused by the recovery cup 650. When the process of supplying the processing liquid L1 to the substrate W is performed more than a certain number of times by the processing liquid supply nozzle 642, as shown in FIG. 7, the byproduct F of the processing liquid L1 may be built up on the outer guide 670, the inner guide 656, and the groove 682 of the bottom surface 664 of the recovery cup 650.

The cleaning of the liquid recovery unit 680 at S1130 includes positioning the jig 1300 at the substrate support unit 630 at S1210, supplying the cleaning liquid L2 to the jig 1300 to clean the liquid recovery unit 680 at S1220, circulating the cleaning liquid L2 at S1230 by injecting air to the groove 682 formed in the bottom surface 664 of the recovery cup 650 surrounding the substrate support unit 630, and discharging the cleaning liquid L2 at S1240.

When the condition for the cleaning of the recovery cup 650 is met, a cleaning process at S1130 with respect to the recovery cup 650 may be performed. In S1210 and S1220, as shown in FIG. 8, the jig 1300 is seated on the support plate 632 of the substrate support unit 630, and the cleaning liquid supply nozzle 1210 discharges the cleaning liquid L2 to the jig 1300 to allow the cleaning liquid L2 to clean the outer guide 670 and the inner guide 656 of the recovery cup 650. At this point, the cleaning liquid L2 is collected in the groove 682 formed in the bottom surface 664. In S1230, while the cleaning liquid L2 is collected in the groove 682, the cleaning liquid L2 may be circulated by air injected by the air injection unit 684. According to the present disclosure, as shown in FIG. 11, the groove 682 may be shaped in a circular shape so that the cleaning liquid L2 for cleaning of the recovery cup 650 may be collected. The discharge port 665 through which the cleaning liquid L2 may be discharged is formed in a part of the groove 682, and the opening and closing valve 686 may control whether or not the discharge port 665 is opened. When the processing liquid L1 is supplied, the opening and closing valve 686 is opened and the processing liquid L1 may be discharged through the discharge port 665, and when the cleaning liquid L2 is supplied, the opening and closing valve 686 is closed and the cleaning processing with respect to the cleaning liquid L2 may be performed.

In S1230, while the cleaning liquid L2 is collected in the groove 682, the cleaning liquid L2 may be circulated by air injected by the air injection unit 684. As shown in FIG. 9, the air injection unit 684 may be provided at the outer wall 666 of the recovery cup 650. The air injection unit 684 may inject air in a direction inclined with respect to the outer wall 666 of the recovery cup 650. As shown in FIG. 11, the air injection unit 684 is installed to be inclined with respect to the outer wall 666 of the recovery cup 650 and may inject air. The cleaning liquid L2 collected in the groove 682 may be circulated in a certain direction (e.g., counterclockwise) by air pressure. The air injection unit 684 includes a plurality of air injection units installed on the outer wall 666 of the recovery cup 650 and may inject air so that the cleaning liquid collected in the groove 682 may be rotated in a certain direction. For example, as shown in FIG. 11, the air injection unit 684 may be composed of a plurality of air injection units arranged at constant intervals on the outer wall 666 of the recovery cup 650. After the cleaning processing is completed, in S1240, the opening and closing valve 686 is opened and the cleaning liquid L2 may be discharged through the discharge port 665.

Although the preferred embodiments of the present disclosure have been disclosed for illustrative purposes, those skilled in the art will appreciate that various modifications, additions and substitutions are possible, without departing from the scope and spirit of the invention as disclosed in the accompanying claims. Since the present disclosure may be embodied in other specific forms without changing the technical sprit or essential features, those skilled in the art to which the present disclosure belongs should understand that the embodiments described above are exemplary and not intended to limit the present disclosure.

The scope of the present disclosure will be defined by the accompanying claims rather than by the detailed description, and those skilled in the art should understand that various modifications, additions and substitutions derived from the meaning and scope of the present disclosure and the equivalent concept thereof are included in the scope of the present disclosure.

What is claimed is:

1. A substrate processing apparatus configured to supply a processing liquid to a substrate to perform processing, the substrate processing apparatus comprising:

a substrate support unit configured to support the substrate;

a liquid supply unit configured to supply a liquid to the substrate; and a liquid recovery unit configured to recover the liquid from the substrate, wherein the liquid recovery unit comprises:

a recovery cup formed to surround the substrate support unit; and an air injection unit configured to inject air to an internal space of the recovery cup, wherein the liquid supply unit comprises:

a processing liquid supply nozzle configured to supply the processing liquid for processing of the substrate; and a cleaning liquid supply nozzle configured to supply a cleaning liquid for cleaning of the recovery cup, wherein a bottom surface of the recovery cup includes a circular groove for collecting the cleaning liquid, and wherein the air injection unit comprises a plurality of air nozzles installed on an outer wall of the recovery cup and the air nozzles are directed toward the circular groove and, when viewed in a plan view, each air nozzle is oriented obliquely with respect to the circular groove so as to inject the air in a direction inclined with respect to the outer wall of the recovery cup, wherein the injected air causes the cleaning liquid collected in the recovery cup to flow in a circumferential direction along the circular groove.

2. The substrate processing apparatus of claim 1, further comprising:

a jig including a body with a rebound groove formed therein, wherein the substrate support unit is configured to selectively support the substrate for the processing of the substrate and the jig for the cleaning of the recovery cup, and wherein the rebound groove of the jig is configured to cause the cleaning liquid supplied from the cleaning liquid supply nozzle to splash toward an inner wall of the recovery cup.

3. The substrate processing apparatus of claim 2, wherein a discharge port through which the cleaning liquid is discharged is formed at a part of the circular groove, whether or not the discharge port is opened is controlled by an opening and closing valve, the cleaning liquid is discharged outwards through the discharge port, and volatile elements of the cleaning liquid are discharged outwards through an inner exhaust port located in the recovery cup.

4. The substrate processing apparatus of claim 1, wherein an internal space in which processing with respect to the substrate is performed is sealed by a housing and a cover, the cover being coupled to an upper surface of the housing, the cover is formed to be inclined from the upper surface of the housing toward a center portion of the cover, and the center portion of the cover comprises an air flow provision unit generating a downward air flow.

5. An operating method of the substrate processing apparatus of claim 1, the operating method comprising:

supplying a processing liquid from the liquid supply unit to the substrate seated on the substrate support unit;

recovering the processing liquid splattering from the substrate by using the liquid recovery unit; and cleaning the liquid recovery unit, wherein the cleaning of the liquid recovery unit comprises:

positioning a jig at the substrate support unit;

supplying the cleaning liquid to the jig to clean the liquid recovery unit; and circulating the cleaning liquid by injecting air to the internal space of the recovery cup surrounding the substrate support unit; and discharging the cleaning liquid.

6. The operating method of claim 5, wherein an internal space in which processing with respect to the substrate is performed is sealed by a housing and a cover, the cover being coupled to an upper surface of the housing, the cover is formed to be inclined from the upper surface of the housing toward a center portion of the cover, and the center portion of the cover comprises an air flow provision unit generating a downward air flow.

7. The operating method of claim 5, wherein a discharge port through which the cleaning liquid is discharged is formed at a part of the circular groove, and whether or not the discharge port is opened is controlled by an opening and closing valve.

8. The operating method of claim 7, the cleaning liquid is discharged outwards through the discharge port, and volatile elements of the cleaning liquid are discharged outwards through an inner exhaust port located in the recovery cup.

9. Photo spinner equipment comprising:

an index module configured to transfer a substrate from a container in which the substrate is received;

a processing module configured to perform a coating process and a developing process with respect to the substrate, and comprising a substrate processing apparatus configured to perform liquid processing on the substrate; and an interface module connecting the processing module to external light exposure equipment, wherein the substrate processing apparatus comprises:

a substrate support unit configured to support the substrate;

a liquid supply unit configured to supply a processing liquid to the substrate; and a liquid recovery unit configured to recover the processing liquid from the substrate, wherein the liquid recovery unit comprises:

a recovery cup formed to surround the substrate support unit; and an air injection unit configured to inject air to an internal space of the recovery cup, wherein the liquid supply unit comprises:

a processing liquid supply nozzle configured to supply the processing liquid for processing of the substrate; and a cleaning liquid supply nozzle configured to supply a cleaning liquid for cleaning of the recovery cup, wherein a bottom surface of the recovery cup includes a circular groove for collecting the cleaning liquid, and wherein the air injection unit comprises a plurality of air nozzles installed on an outer wall of the recovery cup and the air nozzles are directed toward the circular groove and, when viewed in a plan view, each air nozzle is oriented obliquely with respect to the circular groove so as to inject the air in a direction inclined with respect to the outer wall of the recovery cup, wherein the injected air causes the cleaning liquid collected in the recovery cup to flow in a circumferential direction along the circular groove.

10. The photo spinner equipment of claim 9, wherein the substrate processing apparatus further comprises:

a jig including a body with a rebound groove formed therein, wherein the substrate support unit is configured to selectively support the substrate for the processing of the substrate and the jig for the cleaning of the recovery cup, and wherein the rebound groove of the jig is configured to cause the cleaning liquid supplied from the cleaning liquid supply nozzle to splash toward an inner wall of the recovery cup.

11. The photo spinner equipment of claim 10, wherein a discharge port through which the cleaning liquid is discharged is formed at a part of the circular groove, whether or not the discharge port is opened is controlled by an opening and closing valve, the cleaning liquid is discharged outwards through the discharge port, and volatile elements of the cleaning liquid are discharged outwards through an inner exhaust port located in the recovery cup.

12. The photo spinner equipment of claim 9, wherein an internal space in which processing with respect to the substrate is performed is sealed by a housing and a cover, the cover being coupled to an upper surface of the housing, the cover is formed to be inclined from the upper surface of the housing toward a center portion of the cover, and the center portion of the cover comprises an air flow provision unit generating a downward air flow.

* * * * *